United States Patent
Prikhodko et al.

(10) Patent No.: US 8,385,853 B2
(45) Date of Patent: Feb. 26, 2013

(54) SYSTEM AND METHOD FOR POWER DETECTION IN A POWER AMPLIFIER

(75) Inventors: Dima Prikhodko, Burlington, MA (US); Gene A. Tkachenko, Belmont, MA (US); Atiqul Baree, London (GB); Steven C. Sprinkle, Hampstead, NH (US); Paul T. Dicarlo, Marlborough, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 1059 days.

(21) Appl. No.: 12/116,980

(22) Filed: May 8, 2008

(65) Prior Publication Data

US 2008/0284520 A1 Nov. 20, 2008

(51) Int. Cl.
*H03C 1/62* (2006.01)
*H04B 17/00* (2006.01)
*H04B 1/04* (2006.01)
*H01Q 11/12* (2006.01)

(52) U.S. Cl. .................. 455/115.3; 455/127.2

(58) Field of Classification Search ............ 455/115.1, 455/115.3, 126, 127.1, 127.2
See application file for complete search history.

(56) References Cited

U.S. PATENT DOCUMENTS

| | | | |
|---|---|---|---|
| 6,020,787 A | 2/2000 | Kim et al. | |
| 6,265,943 B1 | 7/2001 | Dening et al. | |
| 6,617,920 B2 | 9/2003 | Staudinger et al. | |
| 6,734,729 B1 | 5/2004 | Andrys et al. | |
| 6,847,261 B2 | 1/2005 | Iwata et al. | |
| 7,010,282 B2 | 3/2006 | Kazakevich et al. | |
| 7,433,658 B1* | 10/2008 | Shirvani-Mahdavi et al. | 455/127.2 |
| 2001/0020872 A1* | 9/2001 | Miyazawa | 330/285 |
| 2004/0083409 A1 | 4/2004 | Rozenblit et al. | |
| 2004/0198465 A1 | 10/2004 | Nation | |
| 2005/0245213 A1* | 11/2005 | Hirano et al. | 455/127.1 |
| 2006/0186964 A1* | 8/2006 | Prikhodko et al. | 330/297 |
| 2006/0223462 A1 | 10/2006 | Rahman et al. | |
| 2006/0267688 A1 | 11/2006 | Tomonori et al. | |
| 2007/0008038 A1* | 1/2007 | Klepser et al. | 330/291 |
| 2008/0003962 A1* | 1/2008 | Ngai | 455/179.1 |
| 2009/0289719 A1* | 11/2009 | Van Bezooijen et al. | 330/285 |

OTHER PUBLICATIONS

Supplementary European Search Report for Application No. EP 08 75 5143, completed on Apr. 25, 2012 in 5 pages.
International Search Report for International Application No. PCT/US2008/062988, mailed on Sep. 30, 2008 in 2 pages.
International Preliminary Report on Patentability issued on Nov. 10, 2009 and Written Opinion mailed on Sep. 30, 2008 for International Application No. PCT/US2008/062988.

* cited by examiner

*Primary Examiner* — Nguyen Vo
(74) *Attorney, Agent, or Firm* — Knobbe Martens Olson & Bear LLP

(57) ABSTRACT

A system for detecting power output of a power amplifier includes a first power detector configured to detect a forward power output of a power amplifier, the first power detector configured to provide a first power detector output, and a second power detector configured to receive a collector parameter signal and detect a collector parameter therefrom, the second power detector also configured to provide a second power detector output.

21 Claims, 6 Drawing Sheets

SYSTEM AND METHOD FOR POWER DETECTION IN A POWER AMPLIFIER

CROSS-REFERENCE TO RELATED APPLICATION

This application claims priority to and the benefit of the filing date of U.S. Provisional Patent Application No. 60/917,123, filed on May 10, 2007, entitled "Power Amplifier With Linearity And Power Detection," the entire disclosure of which is hereby incorporated herein by reference.

BACKGROUND

Portable communication devices, such as cellular telephones, personal digital assistants (PDAs), WIFI transceivers, and other communication devices must be capable of communicating more and more data. For example, in the emerging markets of 3G/3.9G, linear systems such as those the communicate using standards such as WCDMA, WiMAX, EUTRAN-LTE, and other non-constant envelope modulation methodologies, the requirement for highly efficient power amplifiers that exhibit good linearity and power control under mismatch continues to be very challenging.

The power detection scheme is one of the key parameters in maintaining power amplifier linearity and linear power control. A number of well-known detection schemes are currently used, including forward power detection using a coupler and a detector; implementing a detector at the power amplifier output, for example, a collector voltage detector; and current detection using a current mirror.

The forward power detection with the coupler and detector methodology is appropriate for a nonlinear system such as GSM because it allows constant output power to be maintained for different mismatch phases. However, such a forward power detection scheme is not as effective for a high peak-to-average ratio (PAR) linear system because for high impedance phases of the output signal the collector voltage has to be significantly increased in order to maintain the same linear output power. Unfortunately, this arrangement leads to earlier power amplifier compression.

Implementing a detector at the power amplifier output, for example, a collector voltage detector is more preferable than output voltage detection because of the phase shift in the matching circuitry. Holding the collector voltage constant in the closed loop keeps the amount of back-off constant for the different mismatch phases. However, this is achieved at the expense of output power. Even though the present requirements for output power deviation are not as stringent in a linear system, excessive power drop under mismatch is not acceptable.

The current detection scheme using a current mirror is not applicable to a linear system because for most nonlinear high impedance phases the current drops, which causes the input power to increase in the closed loop. This leads to further power amplifier compression.

One approach that provides a good compromise between power and linearity is the use of a balanced power amplifier. However, a balanced power amplifier adds complexity and physical size. Further, a balanced power amplifier may introduce additional losses in a 90 degree hybrid circuit, which leads to degraded efficiency.

Therefore, a detector which is capable of detecting output power and maintaining power amplifier linearity is desirable.

SUMMARY

Embodiments of a system for detecting power output of a power amplifier include a first power detector configured to detect a forward power output of a power amplifier, the first power detector configured to provide a first power detector output, and a second power detector configured to receive a collector parameter signal and detect a collector parameter therefrom, the second power detector also configured to provide a second power detector output.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
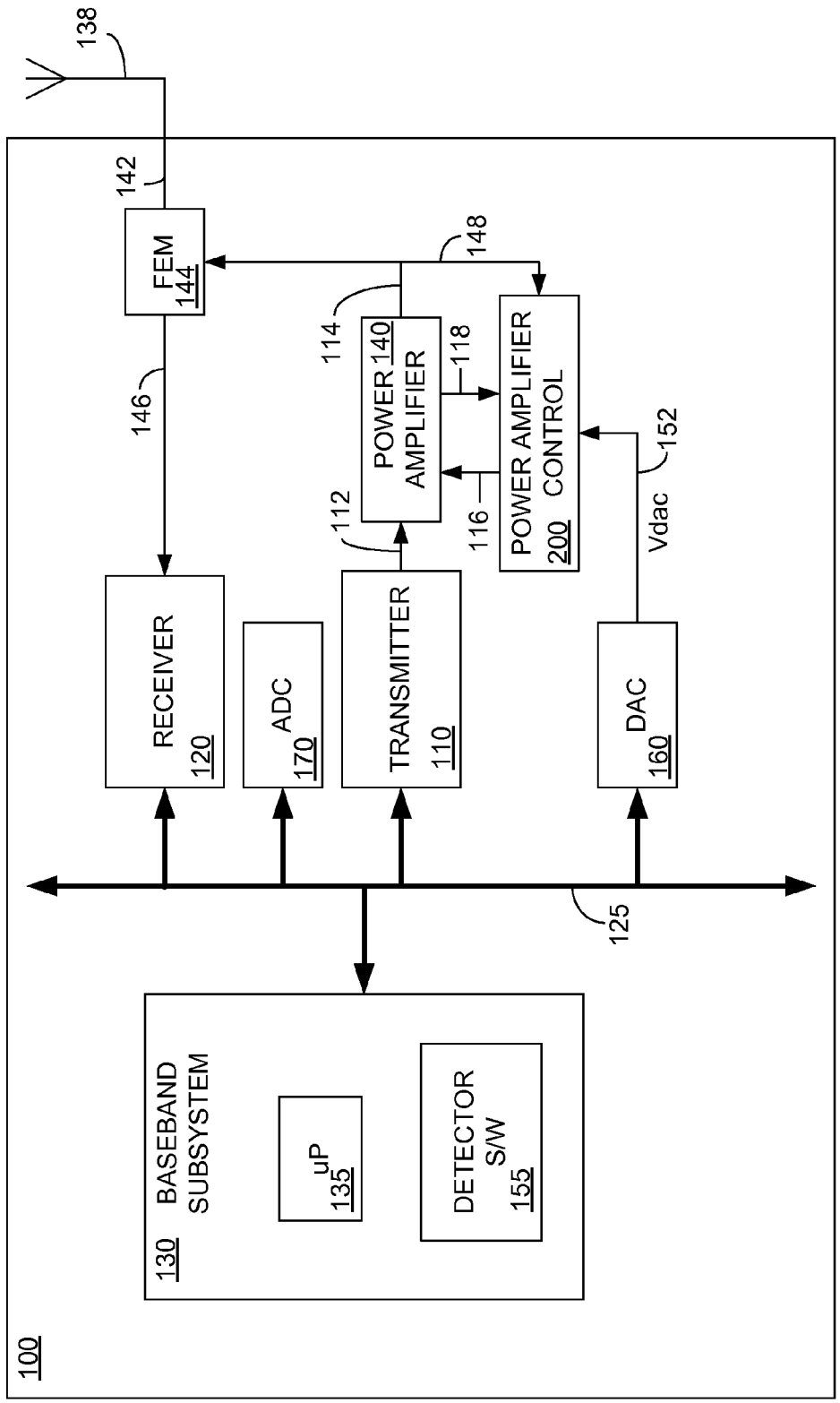
FIG. 1 is a block diagram illustrating a simplified portable transceiver.

Although described with particular reference to a portable transceiver, the system and method for power detection in a power amplifier can be implemented in any transmitter in which it is desirable to detect output power while maximizing the linearity of the power amplifier.

The system and method for power detection in a power amplifier uses both a forward power detector and a secondary detector configured to detect a collector parameter of the power amplifier output stage.

In an embodiment, the collector parameter can be collector voltage. However, other collector parameters, such as collector current, can be detected. The main reason for linearity degradation in a power amplifier is saturation of the power amplifier caused by high collector voltage. Therefore, in an embodiment, collector voltage can be used as a good indicator of the saturation effect or the power amplifier.

The system and method for power detection in a power amplifier can be implemented in hardware, software, or a combination of hardware and software. When implemented in hardware, the system and method for power detection in a power amplifier can be implemented using specialized hardware elements and logic. When the system and method for power detection in a power amplifier is implemented partially in software, the software portion can be used to precisely control the various components in a power amplifier control element. The software can be stored in a memory and executed by a suitable instruction execution system (microprocessor). The hardware implementation of the system and method for power detection in a power amplifier can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the system and method for power detection in a power amplifier comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

FIG. 1 is a block diagram illustrating a simplified portable transceiver 100. Embodiments of the system and method for tuning a radio receiver can be implemented in any radio receiver, and in this example, are implemented in an FM radio receiver. The portable transceiver 100 illustrated in FIG. 1 is intended to be a simplified example and to illustrate one of many possible applications in which the system and method for tuning a radio receiver can be implemented. One having ordinary skill in the art will understand the operation of a portable transceiver. The portable transceiver 100 includes a transmitter 110, a receiver 120, a baseband subsystem 130, a digital-to-analog converter (DAC) 160 and an analog-to-digital converter (ADC) 170 connected over a communication bus 125. The transmitter 110 may include a modulator, an upconverter, and any other functional elements that modulate and upconvert a baseband signal. The receiver 120 includes filter circuitry, downconverter circuitry and demodulation circuitry that enable the recovery of the information signal from the received RF signal. The portable transceiver 100 also includes a power amplifier 140 and a power amplifier control element 200. The output of the transmitter 110 is provided over connection 112 to the power amplifier 140.

The receiver 120 and the power amplifier 140 are connected to a front end module 144. The front end module 144 can be a duplexer, a diplexer, or any element that separates the transmit signal from the receive signal. The front end module 144 is connected to an antenna 138 over connection 142.

In transmit mode, the output of the power amplifier 140 is provided to the front end module 144 over connection antenna 114. In receive mode, the front end module 144 provides a receive signal to the receiver 120 over connection 146.

A portion of the output of the power amplifier 140 is provided to the power amplifier control element 200 over connection 148. The power amplifier control element 200 also receives a power control signal ($V_{dac}$) from the DAC 160 over connection 152 and a collector parameter signal over connection 118. The power amplifier control element 200 provides a power amplifier control signal ($V_L$) to the power amplifier 140 over connection 116. As will be described below, the feedback signal on connection 148 is a signal that is representative of the forward power output of the power amplifier 140. The collector parameter signal on connection 118 is a signal that is representative of a parameter of the collector of the power amplifier output stage. In an embodiment, the collector parameter signal on connection 118 is a voltage signal that represents the collector voltage ($V_{ce}$) on the power amplifier output stage, and is an indicator of power amplifier saturation. However, other collector parameter signals may be monitored.

If portions of the system and method for power detection in a power amplifier are implemented in software, then the baseband subsystem 130 also includes detector software 155 that can be executed by a microprocessor 135, or by another processor, to control the operation of the system and method for power detection in a power amplifier to be described below.

Figure 2:
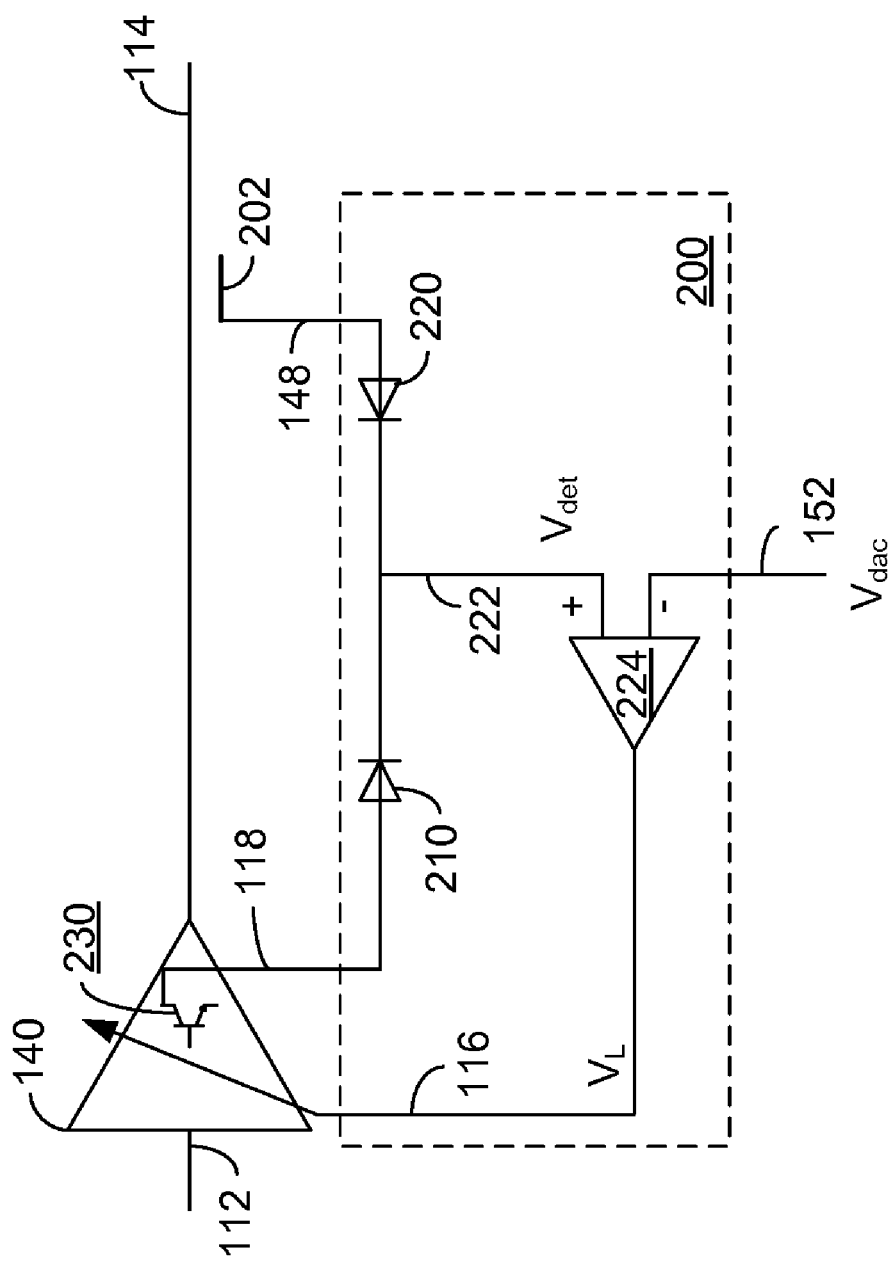
FIG. 2 is a simplified schematic diagram illustrating an embodiment of a power control system implemented using an embodiment of the system and method for power detection in a power amplifier.

FIG. 2 is a simplified schematic diagram illustrating an embodiment of a power control system 200 implemented using an embodiment of the system and method for power detection in a power amplifier. The power amplifier control element 200 receives a portion of the output of the power amplifier 140 on connection 114 via a radio frequency (RF) coupler 200. The RF feedback signal is provided over connection 148 to a first detector 220. For illustrative purposes only, the first detector 220 is illustrated as a diode. In an embodiment, the first detector 220 may comprise a diode detector, or any other type of average or peak power detector. The first detector 220 is also referred to as a forward power detector because it receives the forward power output signal from the power amplifier 140.

Although illustrated schematically as a single power amplifier, the power amplifier 140 includes a number of power amplifier output stages, an exemplary one of which is illustrated schematically as a bi-polar junction transistor using reference numeral 230. However, other transistor structures, such as a field effect transistor, may be implemented. The power amplifier output stage 230 is shown as a bipolar transistor to illustrate that a collector parameter is provided to a second detector 210 over connection 118. The collector parameter can be, for example, a collector voltage signal, a collector current signal, or any other collector parameter that is indicative of whether the power amplifier stage 230 is operating at or near saturation. If the power amplifier is implemented as a field effect transistor, a drain parameter may be used. For example, in a field effect transistor the drain source voltage, Vds, can be measured.

The second detector 210, which is also referred to as a collector parameter detector, can be similar to the first detector 220. The combined output of the second detector 210 and the first detector 220 is a detector signal ($V_{det}$) that is supplied over connection 222 to the non-inverting input of a comparator 224. A reference signal ($V_{dac}$) from the DAC 160 (FIG. 1) is supplied via connection 152 to the inverting input of the comparator 224. The output of the comparator 224 is an error signal representing the difference between the value of $V_{det}$ and $V_{dac}$ and forms the power control signal ($V_L$) that is supplied to the power amplifier 140 over connection 116 and that is used to control the output of the power amplifier 140.

One of the primary causes of power amplifier linearity degradation is saturation of the power amplifier 140 caused by a high collector voltage. Therefore, in an embodiment, the collector voltage of the power amplifier output stage 230 can be used as an indicator of the saturation effect. The combination of the first detector 220 and the second detector 210 monitors both the output power of the power amplifier and the collector voltage of the power amplifier output stage 230.

Figure 3:
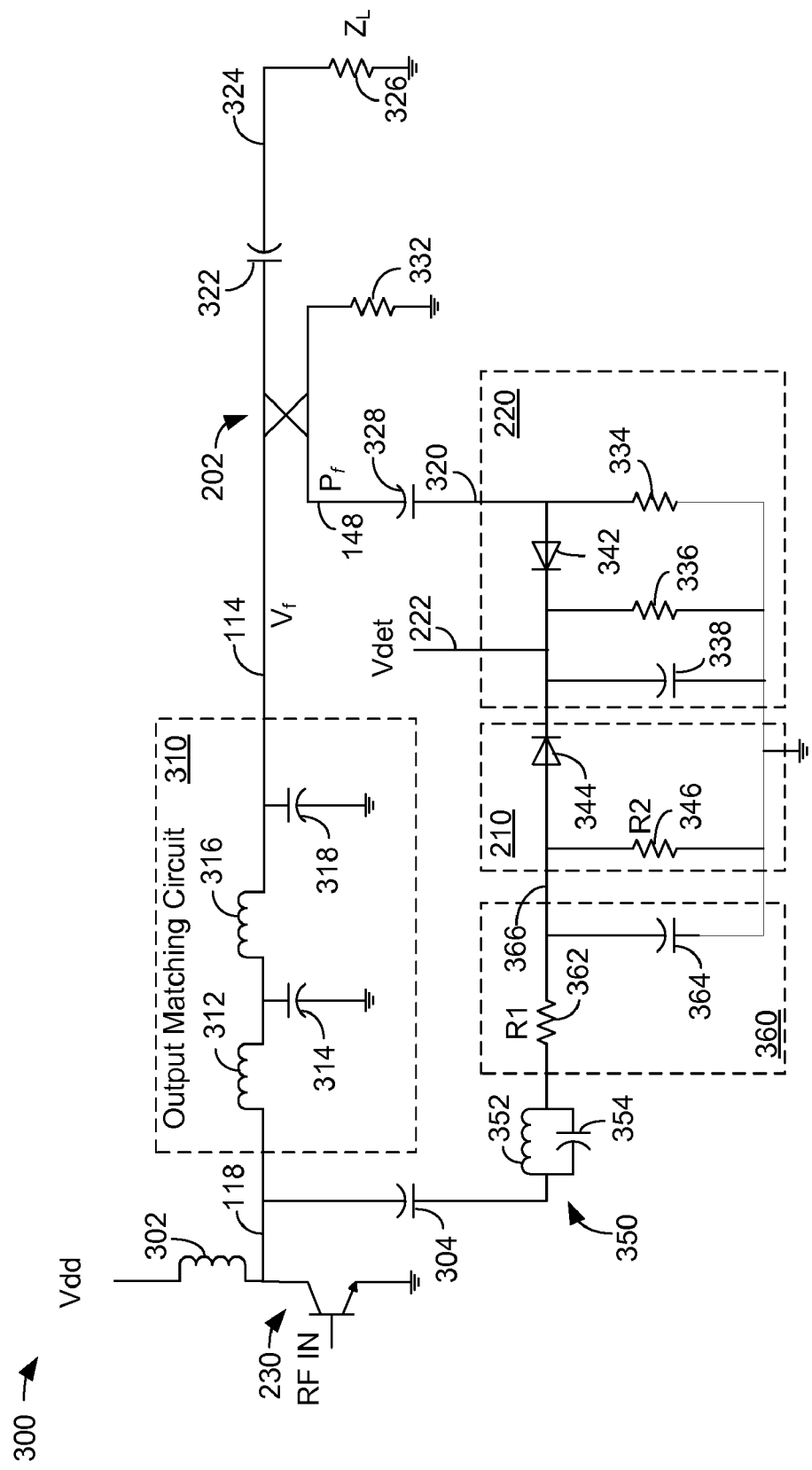
FIG. 3 is a schematic diagram illustrating the system and method for power detection in a power amplifier of FIG. 2.

FIG. 3 is a schematic diagram illustrating an embodiment of the system and method for power detection in a power amplifier of FIG. 2. In this embodiment, the power amplifier output stage 230 is connected through an inductance 302 to system voltage $V_{dd}$. The collector terminal of the power amplifier output stage 230 is connected via connection 118 to an output matching circuit 310. The output matching circuit 310 includes inductances 312 and 316 and capacitances 314 and 318.

It should be understood that inductances, capacitances, and resistances are illustrated in FIG. 3 with the understanding that the functions of these elements may be accomplished by elements, or combinations of elements other than conventional inductors, capacitors, and resistors.

The output of the matching circuit 310 on connection 114 is the output of the power amplifier 140 described above. An RF coupler 202 diverts a portion of the output of the power amplifier 140 on connection 114 via connection 148. The RF energy on connection 148 is passed through a capacitance 328 and is then supplied to the first power detector 220. In this embodiment, the first power detector 220 is also referred to as a forward power detector. The first power detector 220 includes a diode 342, resistances 334 and 336, and a capacitance 338. The RF energy present on connection 320 is rectified by the diode 342 to provide a forward detected power signal on connection 222.

The output of the power amplifier output stage 230 on connection 118 is also provided via a capacitance 304 to a harmonic trap 350. The harmonic trap 350 includes an inductance 352 and a capacitance 354. The output of the harmonic trap 350 is provided to an attenuator/filter 360. The attenuator/filter 360 includes a resistance 362 and a capacitance 364.

For good power detection it is desirable to provide the harmonic trap 350 and the attenuator/filter 360 to allow the second detector 210 to receive a harmonic free detected signal. The harmonic trap 350 and the attenuator/filter 360 prevent harmonics on the signal on connection 118 from entering the second detector 210. The harmonic trap 350 and the attenuator/filter 360 remove all but the fundamental signal components on connection 118. The amount of harmonic filtering and attenuation can be traded off against the accuracy of the linear power detection.

The output of the attenuator/filter 360 is provided over connection to 366 as an input to the second detector 210. The second detector 210 is also referred to as a collector power detector 210. The second detector 210 includes a diode 344 and a resistance 346. The diode 344 rectifies the signal on connection 366 and provides a detector output on connection 222. The signal on connection 222 is a combined detector signal that forms the input the $V_{det}$ to the comparator 224 (FIG. 2).

The output detection voltage ($V_{det}$) is proportional to:

$$V_{det} \sim kV_{ce} + V_f \qquad (Eq.\ 1)$$

where $V_{ce}$ is the collector-emitter voltage on the collector of power amplifier output stage 230, $V_f \sim \sqrt{2P_f Z_L}$ is the forward detected voltage, which is proportional to the forward power ($P_f$) as a function of the load impedance ($Z_L$) and k is a coefficient tunable by varying the resistance 362 (R1).

The value of the resistance 362 (R1) and the value of the resistance 346 (R2) determines the ratio of the output of the first detector 220 and the second detector 210 according to the value of R2/(R1+R2). This defines the value of the signal that will be provided over connection 222. The ratio of the contribution of the first detector 220 and the second detector 210 to the detector signal on connection 222 is determined based on the impedance at the output of the power amplifier load 326.

Figure 4:
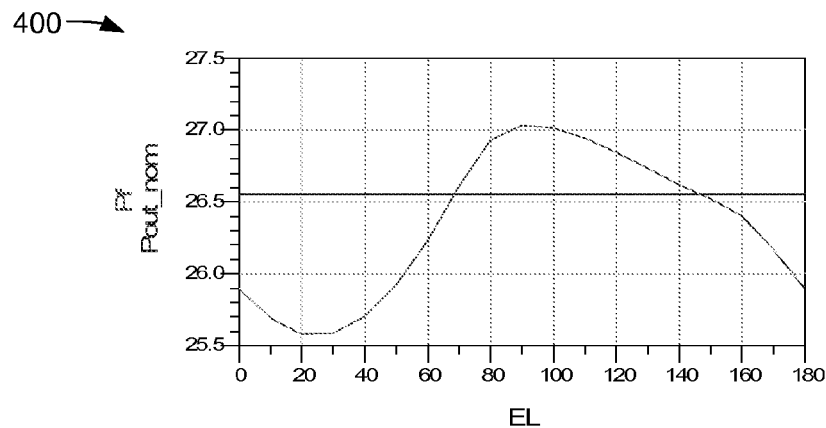
FIG. 4 is a graph illustrating power accuracy for a 1.7:1 voltage standing wave ratio (VSWR).

By choosing different values of R1 the linearity/output power control ratio can be determined. For a power output $P_{out}$=26.5 dBm and a backoff of 3.5 dB ($P_{1dB}$=30 dBm) in 50 Ohm for the value of R1=75 Ohm, a 2.5 dB backoff is maintained for a 3:1 voltage standing wave ratio (VSWR). Further, a power accuracy of +0.4/−1 dB is maintained for a 1.7:1 VSWR, as shown in FIG. 4. When the collector voltage signal on connection 366 becomes dominant, indicating power amplifier saturation, the signal on connection 222 primarily includes the collector voltage of the power amplifier power output stage 230. In this scenario, the combined detector signal ($V_{det}$) provided on connection 222 includes a substantial portion of the collector voltage. In this manner, the level of the collector voltage is used to reduce the output of the power amplifier through the operation of the comparator 224 (FIG. 2) as described above. The value of $V_{det}$ is dependent on the phase of the output signal on connection 114. Therefore, the $V_{det}$ signal on connection 222 also varies with the phase of the output signal. The signal provided by the coupler 202 is phase independent, assuming the coupler provides good isolation. The collector-emitter voltage ($V_{ce}$) across the power output stage 230 is dependent on the phase of the output signal. When the load impedance, $Z_L$ enters a low impedance area, the collector-emitter voltage, $V_{ce}$, decreases and the collector-emitter current, $I_{ce}$, increases, leading to excessive current consumption. When the load impedance, $Z_L$ enters a high impedance area, the collector-emitter voltage, $V_{ce}$, increases and the collector-emitter current, $I_{ce}$, decreases, leading to power amplifier saturation and linearity degradation.

To increase power accuracy, the value of the resistance, 346 (R1), is increased. Increasing the value of the resistance 362 (R1) to a relatively high value compared to resistance 346 (R2) increases the power accuracy of the detectors. The detector voltage, $V_{det}$, is proportional to the collector-emitter voltage ($V_{ce}$) across the power output stage 230 and the forward power detected signal ($V_f$) according to $V_{det} \sim V_{ce} * R2(R1+R2)+V_f$. Therefore, if the value of R1 is very high relative to the value of R2, then $V_{det} \sim V_f$. Thus, gain compression for this scheme for VSWR 3:1 results in power amplifier backoff being reduced only to 0.7 dB compared with 2.5 dB in the case of a relatively low value of R1. Therefore, using only the forward power detector 220 sacrifices power amplifier linearity. A comparison between output power/collector voltage trade-off versus phase for 3:1 VSWR are shown in FIG. 5 and FIG. 6, respectively.

Figure 5:
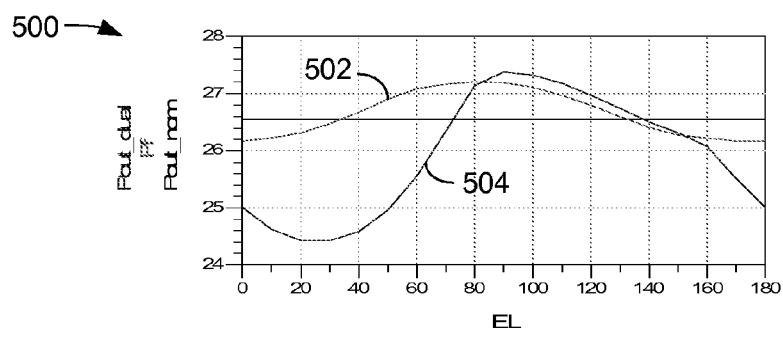
FIG. 5 illustrates power amplifier output power deviation at 3:1 VSWR.

FIG. 5 illustrates power amplifier output power in the situation in which the trace 502 illustrates output power deviation at 3:1 VSWR when just the forward power detector 220 is implemented. The trace 504 illustrates output power deviation at 3:1 VSWR when the first power detector 220 and the second power detector 210 are implemented.

Figure 6:
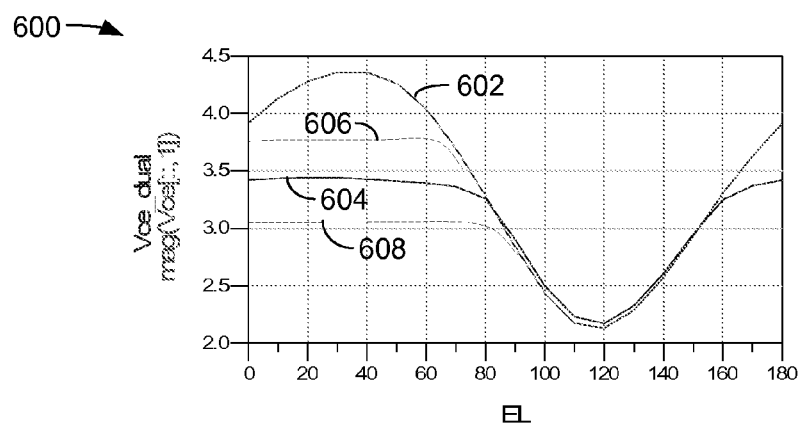
FIG. 6 illustrates collector voltage at 3:1 VSWR for forward power detection and dual power detection.

FIG. 6 illustrates collector voltage in the situation in which the trace 602 illustrates collector voltage at 3:1 VSWR when just the forward power detector 220 is implemented. The trace 604 illustrates collector voltage at 3:1 VSWR when the first power detector 220 and the second power detector 210 are implemented. The trace 604 illustrates that the collector voltage of the power amplifier output stage 230 is fixed during the portion of the output phase where high output impedance exists. The dotted line 606 represents an example upper limit of the collector voltage and the dotted line 608 represents an example lower limit of the collector voltage.

As shown in FIGS. 5 and 6, implementing the dual detector solution allows a tradeoff between linearity and output power accuracy by reducing power for the most nonlinear phases where high impedance is causing the high voltage.

Figure 7:
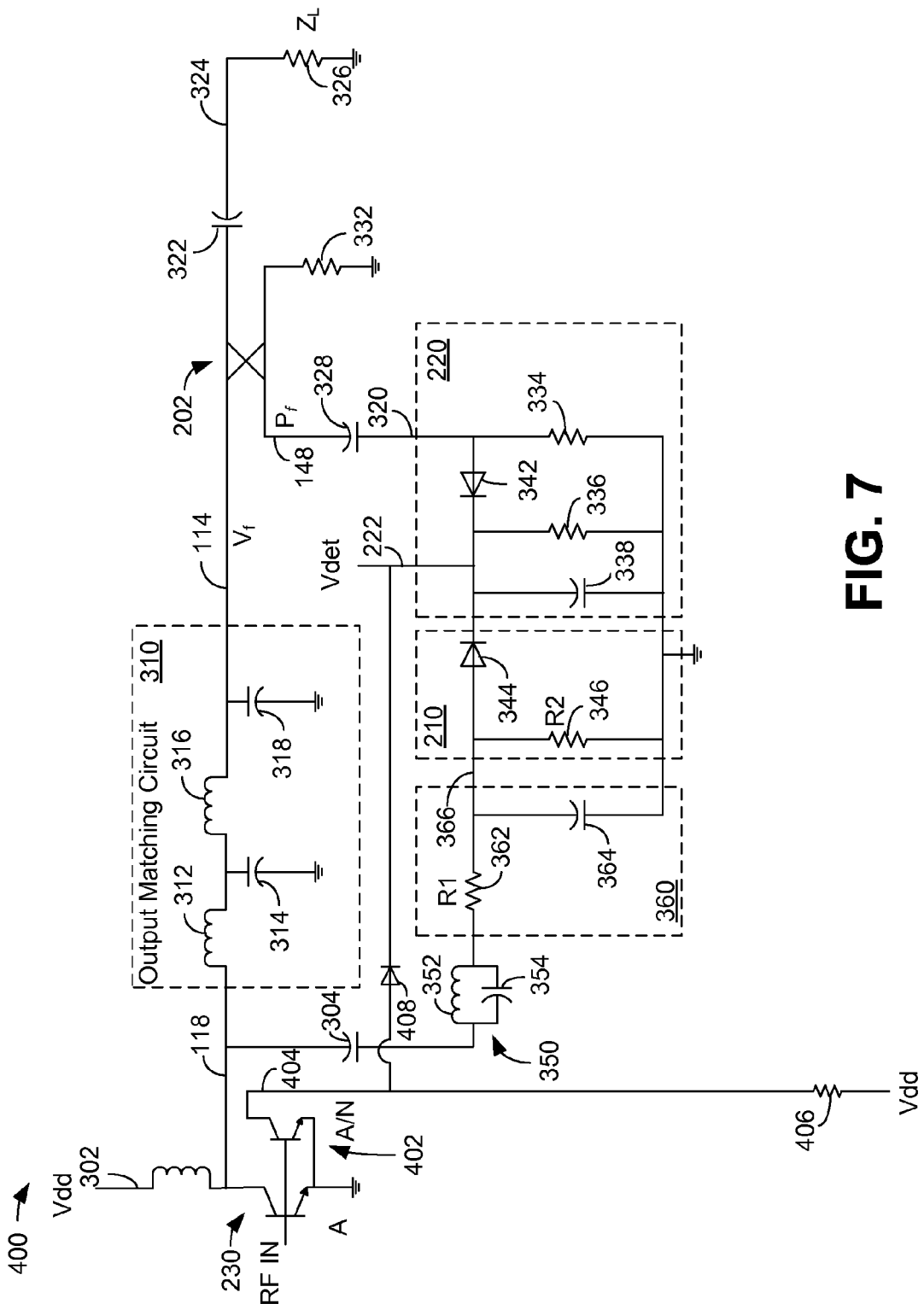
FIG. 7 is a schematic diagram illustrating an alternative embodiment of the system and method for power detection in a power amplifier of FIG. 3.

FIG. 7 is a schematic diagram illustrating an alternative embodiment of the system and method for power detection in a power amplifier of FIG. 3. The architecture of the embodiment of FIG. 7 is similar to the architecture shown in FIG. 3. Similar elements will be identically numbered. To overcome the problem with excessive current consumption, a third current detection architecture can be implemented by using an additional transistor cell having a ratio 1/N with respect to the output stage. In FIG. 7, the power output stage 230 is referred to as "A" and the additional transistor cell is referred to as "A/N". Such a transistor is illustrated at 402. RF current then can be sampled at the collector 404 of transistor 402 and converted to voltage by the resistance 406. The voltage on connection 404 is detected by a diode detector 408 and is added to the common detected signal on connection 222.

Further, the system and method for power detection in a power amplifier described above is applicable to the detection of additional parameters, such as current detection and voltage detection, and is applicable to the detection of such parameters in a communication device that uses multiple modes of communication and that uses multiple communication bands. Further, the detection parameter can be varied when switching from one communication band or mode to another.

Figure 8:
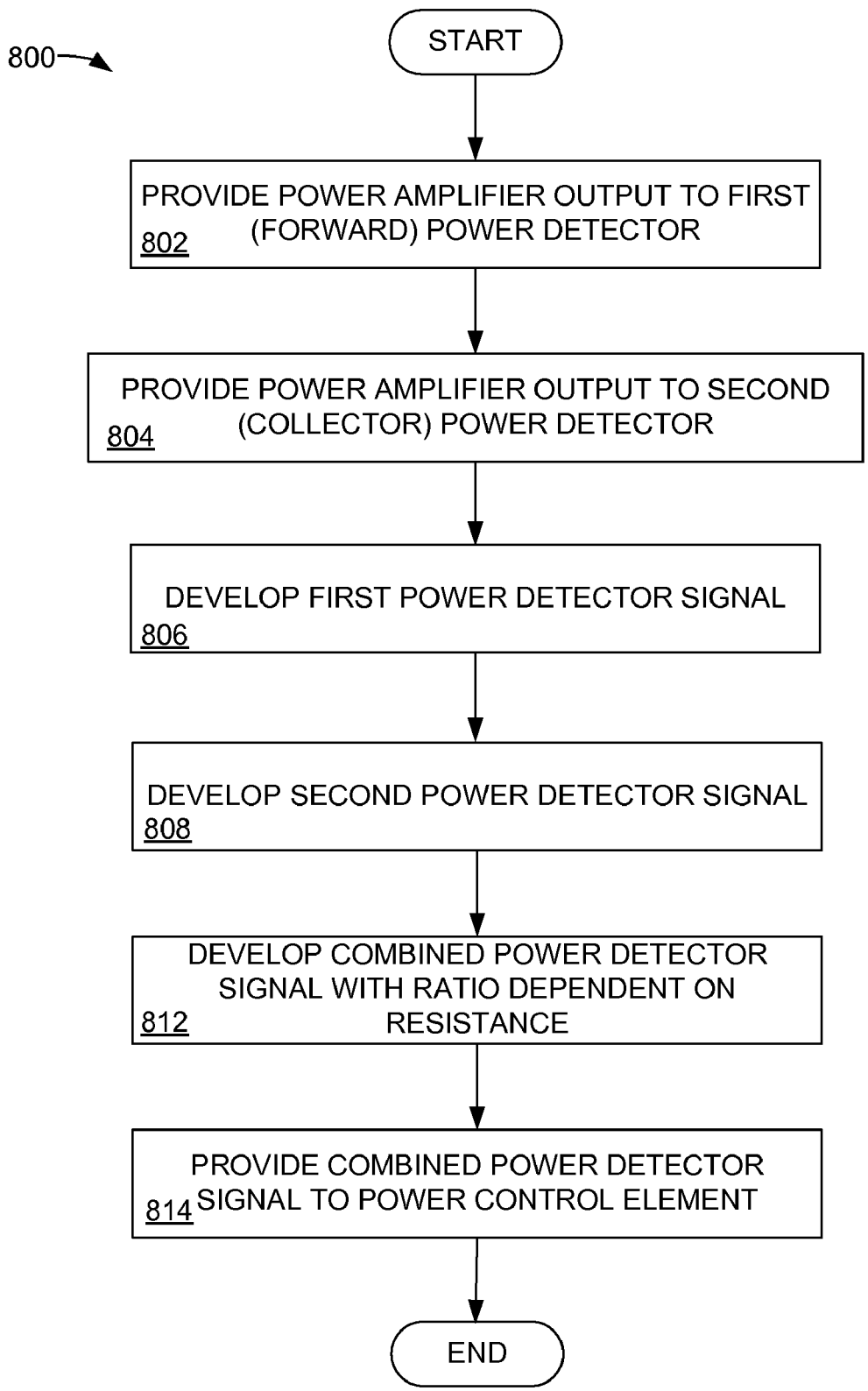
FIG. 8 is a flow chart describing the operation of an embodiment of the system and method for power detection in a power amplifier.

FIG. 8 is a flow chart 800 describing the operation of an embodiment of the system and method for power detection in a power amplifier. The blocks in the flowchart can be performed in or out of the order shown by the elements described above.

In block 802, the output of the power amplifier 140 is provided to a first power detector 220. In block 804, a collector parameter of the power amplifier 140 is provided to a second power detector 210. In block 806, the first power detector 220 forms a first power detector signal. In block 808, the second power detector forms a second power detector signal.

In block 812, a combined power detector signal is developed. The ratio of the first power detector signal to the second power detector signal that makes up the combined power detector signal is dependent on the value of the resistance 362 (R1) and 346 (R2) in FIG. 3. In block 814, the combined power detector signal is provided to the power control element 200 (FIGS. 1 and 2).

While various embodiments of the invention have been described, it will be apparent to those of ordinary skill in the art that many more embodiments and implementations are possible that are within the scope of the invention. For example, the invention is not limited to a specific type of radio transmitter o power amplifier.

Embodiments of the invention are applicable to different types of radio transmitters and power amplifiers and are applicable to any transmitter that transmits a non-constant envelope signal.

What is claimed is:

1. A system for detecting power output of a power amplifier, the system comprising:
   a first power detector configured to detect a forward power output of a power amplifier, the first power detector further configured to provide a first power detector output;
   a second power detector configured to receive a collector parameter signal from a collector terminal of a transistor included in the power amplifier, and to detect a collector parameter based on the collector parameter signal, the second power detector further configured to provide a second power detector output; and
   a harmonic trap and filter configured to receive the collector parameter signal and to remove harmonics present in the collector parameter signal to obtain a filtered collector parameter signal, the harmonic trap and filter further configured to provide the filtered collector parameter signal to the second power detector.

2. The system of claim 1 wherein the collector parameter signal is a collector voltage signal.

3. The system of claim 1 wherein the collector parameter signal is a collector current signal.

4. The system of claim 1 wherein the first power detector output and the second power detector output are combined to form a combined power detector output.

5. The system of claim 4 wherein the combined power detector output includes a ratio of the first power detector output and the second power detector output, the ratio based on at least one resistance value.

6. The system of claim 1 wherein the first and second power detectors are chosen from a peak power detector and an average power detector.

7. The system of claim 1 wherein the first and second power detectors are diode detectors.

8. The system of claim 1 wherein the first and second power detectors control the output linearity of the power amplifier and the collector voltage of the power amplifier.

9. The system of claim 1 further comprising a third power detector configured to receive a second collector parameter signal from a second collector terminal of a second transistor included in the power amplifier, and to detect a second collector parameter based on the second collector parameter signal, the third power detector further configured to provide a voltage signal based on the second collector parameter to the first power detector output and the second power detector output.

10. The system of claim 1 wherein the filtered collector parameter signal includes only the fundamental signal components of the collector parameter signal.

11. A portable transceiver having a system for detecting power output of a power amplifier, the portable transceiver comprising:
   a transmitter operatively coupled to a power amplifier and to a receiver;
   a first power detector configured to detect a forward power output of the power amplifier, the first power detector further configured to provide a first power detector output;

a second power detector configured to receive a collector parameter signal from a collector terminal of a transistor included in the power amplifier, and to detect a collector parameter based on the collector parameter signal, the second power detector further configured to provide a second power detector output; and a harmonic trap and filter configured to receive the collector parameter signal and to remove harmonics present in the collector parameter signal to obtain a filtered collector parameter signal, the harmonic trap and filter further configured to provide the filtered collector parameter signal to the second power detector.

12. The transceiver of claim 11 wherein the collector parameter signal is a collector voltage signal.

13. The transceiver of claim 11 wherein the collector parameter signal is a collector current signal.

14. The transceiver of claim 11 wherein the first power detector output and the second power detector output are combined to form a combined power detector output.

15. The transceiver of claim 14 wherein the combined power detector output includes a ratio of the first power detector output and the second power detector output, the ratio based on at least one resistance value.

16. The transceiver of claim 11 wherein the first and second power detectors control the output linearity of the power amplifier and the collector voltage of the power amplifier.

17. The transceiver of claim 11 wherein the filtered collector parameter includes only the fundamental signal components of the collector parameter signal.

18. A method for detecting power output of a power amplifier, the method comprising:

providing a first power detector output including the forward power output of a power amplifier;

filtering a collector parameter signal developed from a collector parameter of a collector terminal of a transistor included in the power amplifier to remove harmonics present in the collector parameter signal to obtain a filtered collector parameter signal;

providing a second power detector output developed from the filtered collector parameter signal; and combining the first power detector output and the second power detector output to form a combined power detector output.

19. The method of claim 18 further comprising choosing a resistance value, a ratio of the first power detector output and the second power detector output based at least in part on the resistance value.

20. The method of claim 19 further comprising controlling the output linearity of the power amplifier and the collector voltage of the power amplifier based at least in part on the combined power detector output.

21. The method of claim 19 wherein the filtered collector parameter signal includes only the fundamental signal components of the collector parameter signal.

* * * * *

UNITED STATES PATENT AND TRADEMARK OFFICE
CERTIFICATE OF CORRECTION

Page 1 of 1

PATENT NO. : 8,385,853 B2
APPLICATION NO. : 12/116980
DATED : February 26, 2013
INVENTOR(S) : Prikhodko et al.

It is certified that error appears in the above-identified patent and that said Letters Patent is hereby corrected as shown below:

On the Title Page, under Prior Publication Data, please insert --Related U.S. Application Data: (60) Provisional application No. 60/917,123, filed on May 10, 2007.--

In the Specification, in column 8 at line 4-7 (approx.), Delete "Embodiments of the......envelope signal." and insert the same on Col. 8, Line 3 after "amplifier." as a continuation of the same paragraph.

Signed and Sealed this
Fifth Day of November, 2013

Teresa Stanek Rea
*Deputy Director of the United States Patent and Trademark Office*